United States Patent
Huemiller et al.

(10) Patent No.: US 11,630,158 B1
(45) Date of Patent: Apr. 18, 2023

(54) SYSTEM FOR ELECTRO-MAGNETIC INDUCTION SPECTROSCOPY (EMIS) OF BATTERY CELLS WHILE FORMING AND CYCLING

(71) Applicant: GM GLOBAL TECHNOLOGY OPERATIONS LLC, Detroit, MI (US)

(72) Inventors: Erik Damon Huemiller, Waterford, MI (US); Ryan Curtis Sekol, Grosse Pointe Woods, MI (US); Shaomao Xu, Sterling Heights, MI (US); Duane S. Carper, Davison, MI (US); Nahel Eshaq, Rochester, MI (US); Raffaello Ardanese, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/490,519

(22) Filed: Sep. 30, 2021

(51) Int. Cl.
G01R 31/382 (2019.01)
H01M 10/48 (2006.01)
G01R 31/392 (2019.01)
H01M 10/0525 (2010.01)
H01M 10/42 (2006.01)

(52) U.S. Cl.
CPC ......... G01R 31/382 (2019.01); G01R 31/392 (2019.01); H01M 10/0525 (2013.01); H01M 10/4285 (2013.01); H01M 10/48 (2013.01); H01M 2220/20 (2013.01)

(58) Field of Classification Search
CPC .............. G01R 31/382; G01R 31/392; H01M 10/0525; H01M 10/4285; H01M 10/48; H01M 2220/20; H01M 4/386
USPC .............. 324/200, 207.11–207.19, 219–241, 324/425–437, 443–447, 500, 515, 529, 324/530, 750.06
See application file for complete search history.

(56) References Cited

U.S. PATENT DOCUMENTS

| 9,658,292 | B2 | 5/2017 | Roumi et al. | |
| 10,071,648 | B1 * | 9/2018 | K | B60L 58/16 |
| 2008/0254359 | A1 * | 10/2008 | Byun | H01M 10/4257 429/163 |
| 2022/0285723 | A1 * | 9/2022 | Park | H01M 4/386 |

* cited by examiner

*Primary Examiner* — Lee E Rodak
*Assistant Examiner* — Trung Q Nguyen

(57) ABSTRACT

A system for testing a battery cell includes a test fixture configured to enclose the battery cell, a battery cycler configured to alternately charge and discharge the battery cell, an antenna mounted on a surface of the test fixture, the antenna configured to detect an electromagnetic signature of the battery cell and generate a signal indicative of the electromagnetic signature, and a detection module configured to receive the signal and detect characteristics of the battery cell based on the signal.

20 Claims, 4 Drawing Sheets

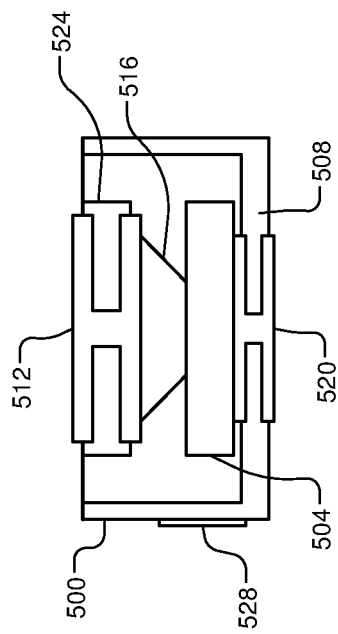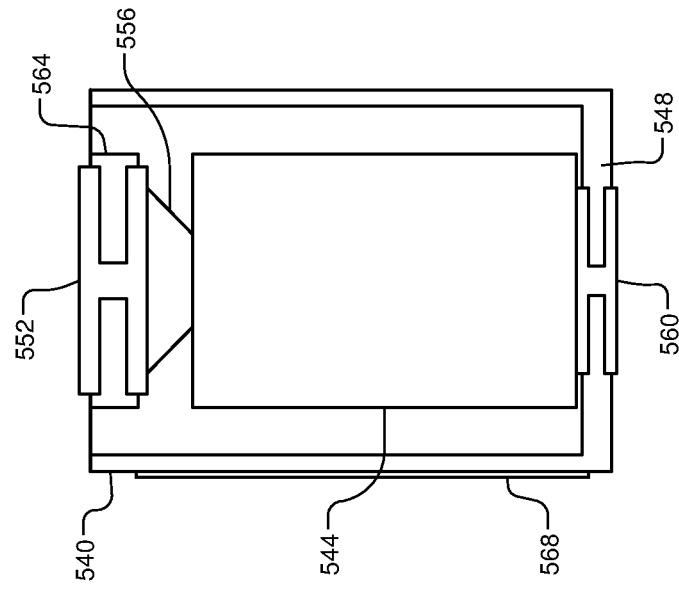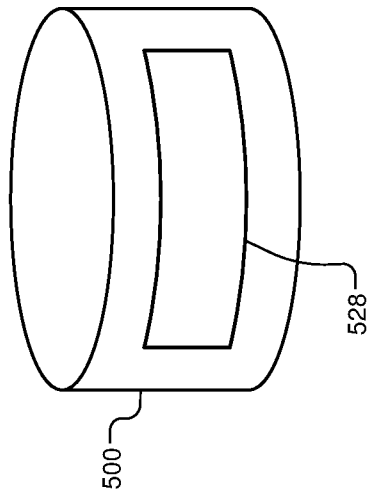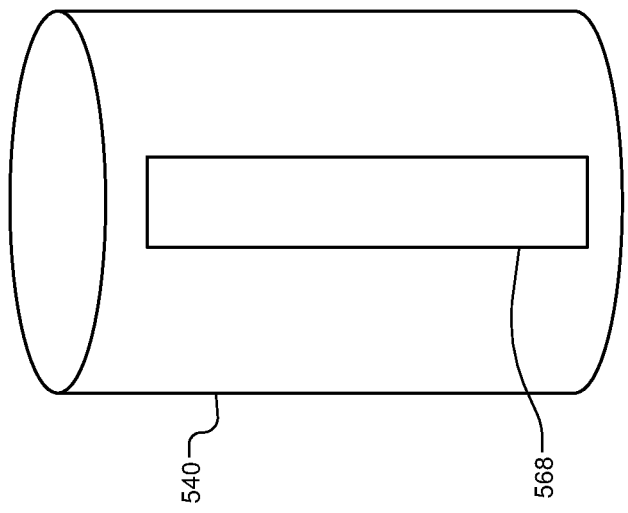
FIG. 5A
FIG. 5B

SYSTEM FOR ELECTRO-MAGNETIC INDUCTION SPECTROSCOPY (EMIS) OF BATTERY CELLS WHILE FORMING AND CYCLING

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to systems and methods for measuring an electro-magnetic signature of a battery cell.

A battery (e.g., a battery for hybrid and/or electric vehicles) includes a separator arranged between electrodes (e.g., an anode and a cathode) of the battery. The separator is a permeable membrane that electrically isolates the electrodes from one another to prevent short circuiting while also allowing ionic flow between the electrodes.

SUMMARY

A system for testing a battery cell includes a test fixture configured to enclose the battery cell, a battery cycler configured to alternately charge and discharge the battery cell, an antenna mounted on a surface of the test fixture, the antenna configured to detect an electromagnetic signature of the battery cell and generate a signal indicative of the electromagnetic signature, and a detection module configured to receive the signal and detect characteristics of the battery cell based on the signal.

In other features, the test fixture includes a bottom plate and a top plate mounted on and spaced apart from the bottom plate, and the battery cell is arranged between the bottom plate and the top plate.

In other features, the antenna is arranged on an antenna plate and the antenna plate is arranged on an upper surface of the bottom plate.

In other features, the battery cell is arranged on the antenna plate such that the antenna is arranged between the battery cell and the antenna plate.

In other features, the detection module is arranged within the test fixture adjacent to the antenna plate.

In other features, the detection module is arranged on the antenna plate.

In other features, the detection module is external to the test fixture.

In other features, a second test fixture is vertically stacked above the test fixture and the second test fixture includes a second antenna mounted on a surface of the second test fixture.

In other features, a plurality of second test fixtures are in a vertically-stacked arrangement with the test fixture and each of the plurality of second test fixtures includes a respective one of a plurality of antennas.

In other features, the test fixture is arranged within the temperature-controlled chamber.

In other features, the detection module is configured to perform electromagnetic induction spectroscopy on the signal.

In other features, the characteristics include a presence or absence of dendrites in the battery cell.

In other features, the battery cell is a lithium ion battery cell.

In other features, the battery cell is a pouch cell.

In other features, the battery cell is a coin-cell type battery.

In other features, the battery cell is a cylindrical battery.

A system for testing a battery cell includes at least one test fixture configured to enclose the battery cell. The at least one test fixture includes a bottom plate, a top plate mounted on and spaced apart from the bottom plate, an antenna mounted on an upper surface of the bottom plate, and the battery cell. The battery cell is arranged within the test fixture on the bottom plate such that the antenna is located between the battery cell and the bottom plate. A battery cycler is configured to alternately charge and discharge the battery cell. The antenna is configured to detect an electromagnetic signature of the battery cell during the charging and discharging and generate a signal indicative of the electromagnetic signature. A detection module is configured to receive the signal and detect characteristics of the battery cell based on the signal.

In other features, the at least one test fixture includes a plurality of test fixtures in a vertically-stacked arrangement.

In other features, the characteristics include a presence or absence of dendrites within the battery cell.

In other features, the battery cell is a lithium ion battery cell.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5A is an example test fixture for a coin-cell type battery; and

FIG. 5B is an example test fixture for a cylindrical battery.

In the drawings, reference numbers may be reused to identify similar and/or identical elements.

DETAILED DESCRIPTION

Hybrid electric and electric vehicles typically include one or more rechargeable batteries each including a plurality of battery cells. Types of rechargeable batteries include, but are not limited to, lithium ion, lithium-sulfur (Li—S), lithium metal, and/or other types of rechargeable batteries.

Over a lifetime of use, batteries experience large numbers of charging and discharging cycles. In some batteries (e.g., lithium ion batteries), ions returning across a battery separator from a cathode side of a cell to an anode side of a cell may not be redistributed evenly on a surface of the anode. Buildup of ions form dendrites which, over time, may pierce the separator, contact the cathode, and cause a short circuit.

Systems and methods according to the present disclosure are configured to measure electromagnetic signatures of a battery cells during manufacture. For example, individual cells may be tested prior to assembly and installation by cycling the cells through multiple charging and discharging cycles. During cycling, each cell is mounted within a test fixture and an antenna detects the electromagnetic signature of the cell. The antenna outputs a signal that includes an indication of the electromagnetic signature. An electromagnetic induction spectroscopy (EMIS) module is configured to receive the signal and perform EMIS on the electromagnetic signature. Although described herein with respect to vehicle batteries (e.g., rechargeable batteries for electric or hybrid vehicles), the principles of the present disclosure may be applied to batteries used in non-vehicle applications.

Figure 1:
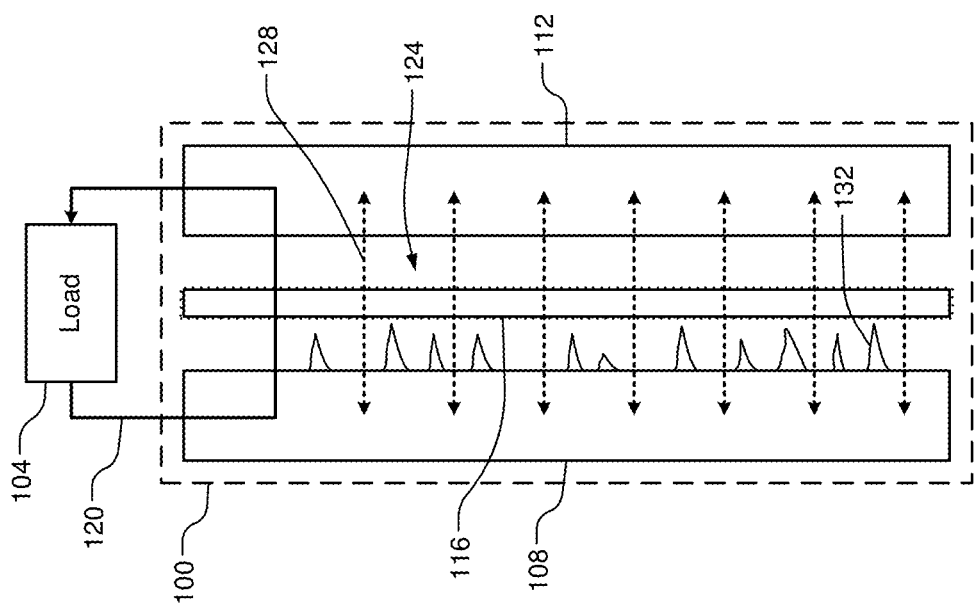
FIG. 1 is an example battery cell.

An example battery (e.g., a battery cell) 100 for powering a load 104 is shown in FIG. 1. For example, the battery 100 corresponds to a lithium ion, Li—S, or lithium metal battery for a vehicle. The battery 100 includes an anode 108, a cathode 112, and a separator 116 arranged between the anode 108 and the cathode 112. For example, the separator 116 is comprised of a flexible, permeable membrane. When powering the load 104 (i.e., discharging), current flows from the anode 108 to the cathode 112 and through the load 104 in a direction indicated by arrow 120. Conversely, when charging (e.g., using a motor or other charging source), current flows from a charging source through the cathode 112 and into the anode 108 in a direction opposite the arrow 120.

An electrolyte material 124 contained within the battery 100 surrounds the anode 108 and the cathode 112. The separator 116 electrically isolates the anode 108 and the cathode 112 from each other while allowing charged ions of the electrolyte material 124 to flow through the separator 116 as shown by arrows 128. In some conditions, buildup of ions returning from the cathode 112 to the anode 108 may form dendrites 132 extending from a surface of the anode 108 toward the separator 116. Systems and methods according to the present disclosure detect an electromagnetic signature of the battery 100 that may indicate the presence or absence of the dendrites 132.

Figure 2:
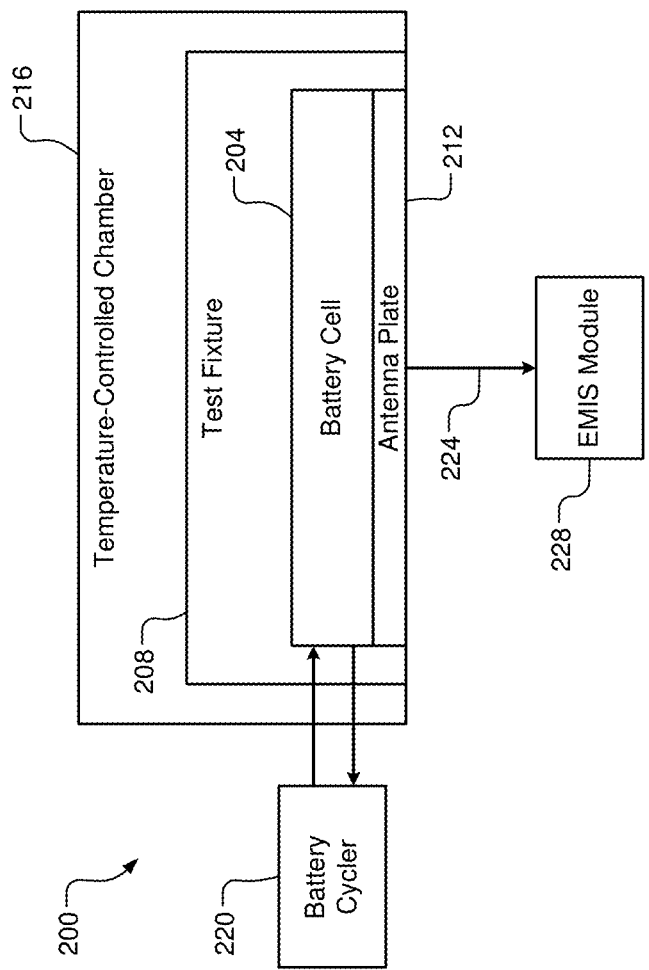
FIG. 2 is an example system for detecting an electromagnetic signature of a battery cell.

Referring now to FIG. 2, an example system 200 for detecting an electromagnetic signature of a battery cell (e.g., a pouch cell) 204 under test is shown. The battery cell 204 is mounted within a test fixture 208 including an integrated antenna plate 212. For example, the antenna plate 212 may be mounted on or within a bottom surface (as shown), a sidewall surface, an upper surface, etc. of the test fixture 208. When arranged within the test fixture 208, the battery cell 204 is in direct contact or in close proximity to the antenna plate 212. In this manner, an antenna (not shown in FIG. 2) mounted on or within the antenna plate 212 is coupled to the electromagnetic signature of the battery cell 204 during charging and discharging. In some examples, the test fixture 208 is enclosed within a temperature-controlled chamber 216.

During testing (e.g., prior to assembly and installation of a battery including the battery cell 204), a battery cycler 220 is connected to the battery cell 204 and performs multiple charging and discharging cycles. For example, the battery cycler 220 is configured to alternately charge (e.g., supply a DC current to) and discharge (e.g., draw current from) the battery cell 204 for a predetermined testing period. The antenna plate 212 outputs a signal 224 (e.g., via a coaxial cable) indicative of the electromagnetic signature of the battery cell 204. For example, certain conditions of the battery cell 204 (e.g., the presence or formation of dendrites) may cause an AC response in the electromagnetic signature of the battery cell 204. Conversely, the signal 224 may have zero or constant magnitude (e.g., may be undetectable, notwithstanding noise or other interference) when dendrites or other anomalies are not present.

A detection module (e.g., an EMIS module) 228 is configured to receive the signal 224 and perform EMIS on the electromagnetic signature. For example, the EMIS module 228 implements a filtering device (e.g., an AC filtering device) configured to isolate the electromagnetic signature of the battery cell 204 in the signal 224. The EMIS module 228 may be located inside the test fixture 208, external to the test fixture 208 but within the temperature-controlled chamber 216, external to the test fixture 208 and the temperature-controlled chamber 216, etc. In some examples, the EMIS module 228 is mounted within the test fixture 208 (e.g., adjacent to the antenna plate 212, on a same substrate or printed circuit board (PCB) as the antenna, etc.) to reduce noise associated with transmitting signal over a length of wire.

Figure 3A:
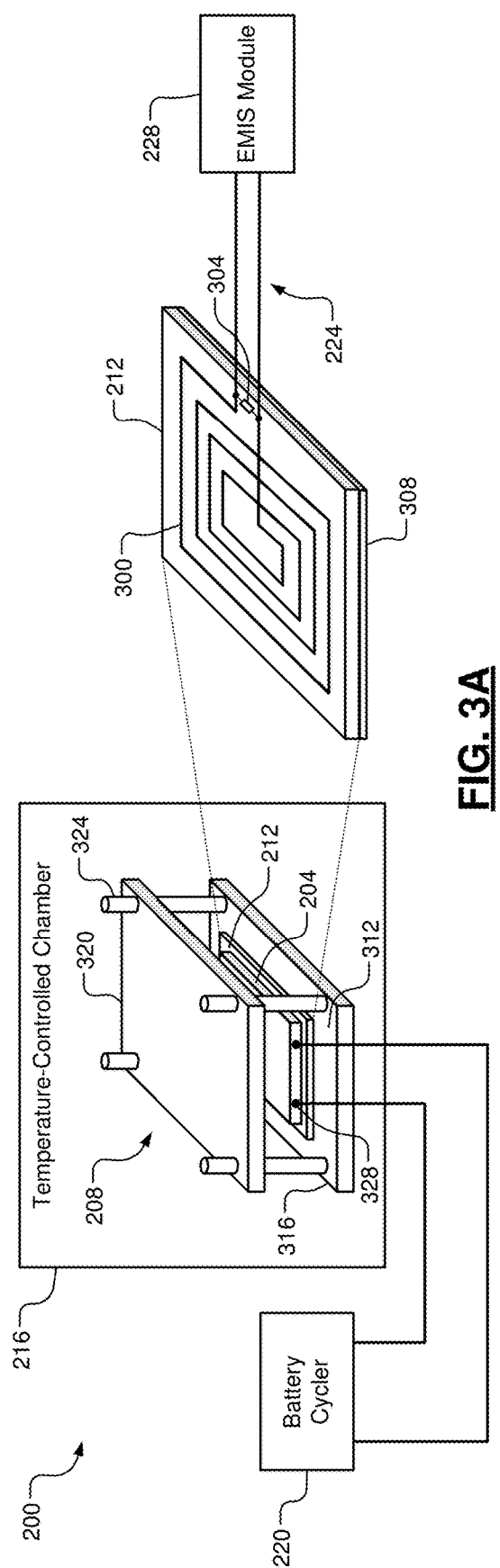
FIGS. 3A and 3B show an example test fixture of the system of FIG. 2.
Figure 3B:
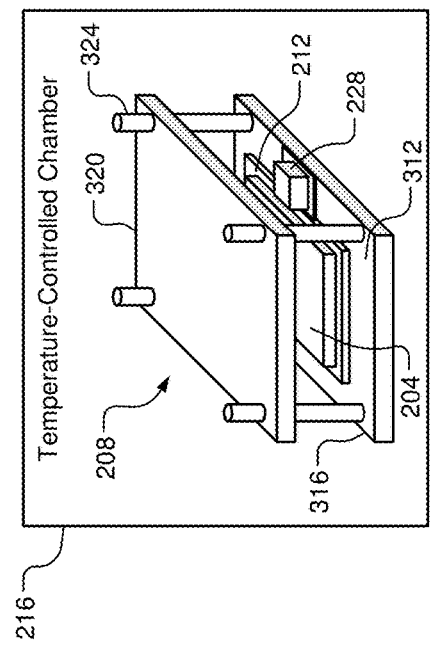

Examples of the system 200 are shown in more detail in FIGS. 3A and 3B. In FIG. 3A, the EMIS module 228 is external to the test fixture 208 and the temperature-controlled chamber 216. In FIG. 3B, the EMIS module 228 is mounted within the test fixture 208. As shown in FIG. 3B, the EMIS module 228 is directly adjacent to the antenna plate 212. In other examples, the EMIS module 228 may be mounted on the antenna plate 212, on a same plate, substrate, or PCB as the antenna, etc. In one example, the antenna plate 212 corresponds to or includes an integrated circuit including the antenna and the EMIS module 228.

An antenna 300 is mounted on or within the antenna plate 212. For example, the antenna 300 comprises copper (e.g., a copper trace formed on or in the antenna plate 212). In some examples, the antenna plate 212 is a PCB and the antenna 300 is a copper trace formed on or within the PCB. One or more tuning elements 304 may be coupled to the antenna 300 to allow tuning of an impedance of the antenna 300 to match an output impedance (e.g., an impedance of a wire or cable carrying the signal 224 and the EMIS module 228). For example, the tuning element 304 may include fixed or adjustable components such as resistors, capacitors, inductors, etc. configured as an impedance tuning network.

The antenna 300 is configured to have an area and outer perimeter substantially the same as (i.e., as near as possible to, such as an outer perimeter within 5 mm of) the battery cell 204. In other words, the antenna 300 is arranged to cover an entire area of the electromagnetic signature of the battery cell 204. In this manner, the antenna 300 is configured to detect anomalies (e.g., indications of dendrites) anywhere in the battery cell 204. Further, a shape of the antenna 300 is configured to maximize coverage of the battery cell 204. For example, as shown, the antenna 300 has a spiral shape. In other examples, the antenna 300 may have other suitable shapes that maximize a pitch and/or density of antenna traces within the outer perimeter of the battery cell 204.

The antenna plate 212 may be comprised of a polymer support or film (e.g., a polyester film) arranged on a mounting surface 312 of the test fixture 208. For example, the antenna plate 212 may be attached to the test fixture 208 using an adhesive layer 308. In other examples, the antenna plate 212 and/or the antenna 300 may be embedded within the mounting surface 312 of the test fixture 208, the antenna 300 may be attached to or mounted directly on the mounting surface 312 of the test fixture 208, etc.

As shown, the test fixture 208 corresponds to a housing comprising a bottom plate 316 and a top plate 320. The top plate 320 is connected to and spaced apart from the bottom plate 316 using posts or dowels 324 (e.g., one post 324 arranged at each corner of the test fixture 208). The bottom plate 316 and the top plate 320 define an interior volume to house the battery cell 204 (e.g., a pouch cell including positive and negative terminals 328 arranged to be connected to the battery cycler 220). For example, the mounting surface 312 corresponds to an upper surface of the bottom plate 316, the antenna plate 212 is attached to the bottom plate 316, and the battery cell 204 is arranged on the antenna plate 212.

Figure 4:
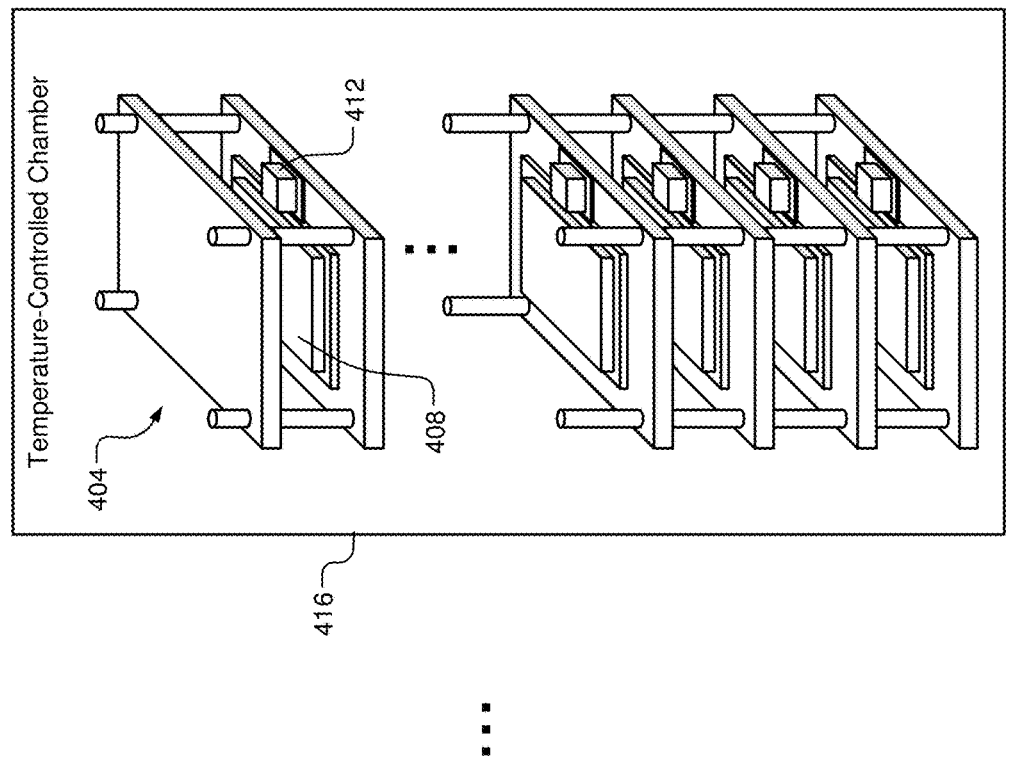
FIG. 4 is an example system including a plurality of vertically stacked test fixtures.
Figure 4:
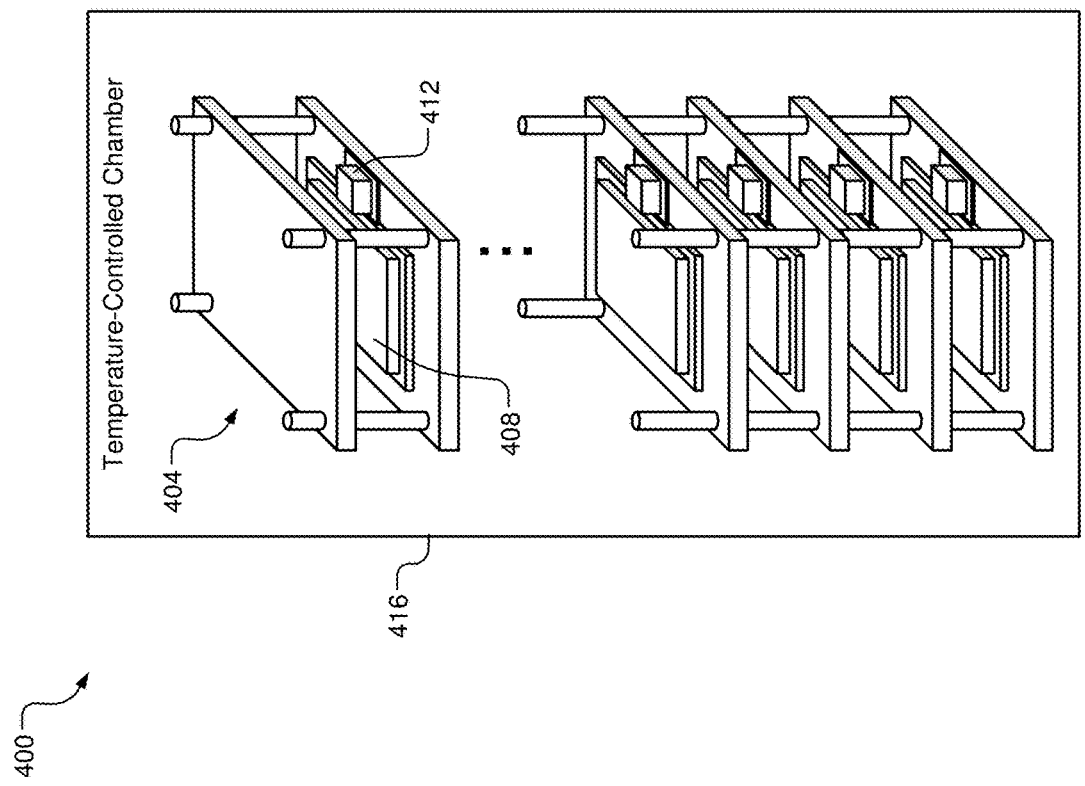

In another example system 400 shown in FIG. 4, a plurality (e.g., two or more) test fixtures 404 configured to hold a respective battery cell 408 are vertically stacked (i.e., stacked in a column). Each test fixture 404 may be connected to a respective EMIS module 412 (as shown). In other examples, two or more test fixtures 404 (each of the test fixtures 404 in a given column) may be connected to and share a same one of the EMIS modules 412. One or more vertical stacks of the test fixtures 404 may be arranged in a temperature-controlled chamber 416. The system 400 may include one temperature-controlled chamber 416 or multiple temperature-controlled chambers 416 each including one or more vertical stacks of the test fixtures 404. The EMIS modules 412 may be arranged within the test fixtures 404, external to the temperature-controlled chambers 416, etc. Each of the test fixtures 404 may be configured to connect to a respective battery cycler 220 or two or more of the test fixtures 404 may share a same battery cycler 220.

Although described above with respect to a pouch cell or a generally rectangular battery cell 204, the principles of the present disclosure may also be implemented for testing other types of batteries or battery cells. For example, in FIG. 5A, a test fixture 500 shown in isometric and cross-sectional views is configured to retain a coin-cell type battery 504. The test fixture 500 includes a cup 508 or other hollow cylinder configured to enclose the battery 504. The battery 504 is retained between a top electrode or terminal 512, a conductive spring or other biasing element 516, and a bottom electrode or terminal 520. For example, the top electrode 512 is integrated with a cap 524 of the test fixture 500.

As shown, an antenna 528 (e.g., a flexible or tape antenna) is affixed to an outer surface (e.g., a sidewall) of the test fixture 500. In other examples, the antenna 528 may be arranged on a top, bottom, or interior surface of the test fixture 500. The antenna 528 is configured to detect an electromagnetic signature of the battery 504 during charging and discharging (e.g., while connected to a battery cycler via the top electrode 512 and the bottom electrode 520).

In FIG. 5B, a test fixture 540 shown in isometric and cross-sectional views is configured to retain a cylindrical battery or battery cell 544. The test fixture 540 includes a cup 548 or other hollow cylinder configured to enclose the battery 544. The battery 544 is retained between a top electrode or terminal 552, a conductive spring or other biasing element 556, and a bottom electrode or terminal 560. For example, the top electrode 552 is integrated with a cap 564 of the test fixture 540.

As shown, an antenna 568 (e.g., a flexible or tape antenna) is affixed to an outer surface (e.g., a sidewall) of the test fixture 540. In other examples, the antenna 568 may be arranged on a top, bottom, or interior surface of the test fixture 540. The antenna 568 is configured to detect an electromagnetic signature of the battery 544 during charging and discharging (e.g., while connected to a battery cycler via the top electrode 552 and the bottom electrode 560).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system for testing a battery cell, the system comprising:
    a test fixture configured to enclose the battery cell;
    a battery cycler configured to alternately charge and discharge the battery cell;
    an antenna, separate from the battery cell, mounted on a surface of the test fixture, the antenna configured to (i) detect and measure an electromagnetic signature of the battery cell while the battery cell is being alternately charged and discharged by the battery cycler and (ii) generate a signal indicative of the electromagnetic signature as detected while the battery cell is being alternately charged and discharged by the battery cycler; and
    a detection module configured to receive the signal, analyze the electromagnetic signature of the battery cell as indicated by the signal, and detect characteristics of the battery cell based on the electromagnetic signature.

2. The system of claim 1, wherein the test fixture includes a bottom plate and a top plate mounted on and spaced apart from the bottom plate, and wherein the battery cell is arranged between the bottom plate and the top plate.

3. The system of claim 2, wherein the antenna is arranged on an antenna plate and the antenna plate is arranged on an upper surface of the bottom plate.

4. The system of claim 3, wherein the battery cell is arranged on the antenna plate such that the antenna is arranged between the battery cell and the antenna plate.

5. The system of claim 4, wherein the detection module is arranged within the test fixture adjacent to the antenna plate.

6. The system of claim 4, wherein the detection module is arranged on the antenna plate.

7. The system of claim 4, wherein the detection module is external to the test fixture.

8. The system of claim 1, further comprising a second test fixture vertically stacked above the test fixture, wherein the second test fixture comprises a second antenna mounted on a surface of the second test fixture.

9. The system of claim 1, further comprising a plurality of second test fixtures in a vertically-stacked arrangement with the test fixture, each of the plurality of second test fixtures including a respective one of a plurality of antennas.

10. The system of claim 1, further comprising a temperature-controlled chamber, wherein the test fixture is arranged within the temperature-controlled chamber.

11. The system of claim 1, wherein the detection module is configured to perform electromagnetic induction spectroscopy on the signal.

12. The system of claim 1, wherein the characteristics include a presence or absence of dendrites in the battery cell.

13. The system of claim 1, wherein the battery cell is a 1 m ion battery cell.

14. The system of claim 1, wherein the battery cell is a pouch cell.

15. The system of claim 1, wherein the battery cell is a coin-cell type battery.

16. The system of claim 1, wherein the battery cell is a cylindrical battery.

17. A system for testing a battery cell, the system comprising:
    at least one test fixture, wherein the at least one test fixture is configured to enclose the battery cell, and wherein the at least one test fixture includes a bottom plate, a top plate mounted on and spaced apart from the bottom plate, an antenna, separate from the battery cell, mounted on an upper surface of the bottom plate, and the battery cell, herein the battery cell is arranged within the test fixture on the bottom plate such that the antenna is located between the battery cell and the bottom plate;

a battery cycler configured to alternately charge and discharge the battery cell, wherein the antenna is configured to (i) detect and measure an electromagnetic signature of the battery cell during the charging and discharging performed by the battery cycler and (ii) generate a signal indicative of the electromagnetic signature as detected while the battery cell is being alternately charged and discharged by the battery cycler; and a detection module configured to receive the signal, analyze the electromagnetic signature of the battery cell as indicated by the signal, and detect characteristics of the battery cell based on the electromagnetic signature.

18. The system of claim 17, wherein the at least one test fixture includes a plurality of test fixtures in a vertically-stacked arrangement.

19. The system of claim 17, wherein the characteristics include a presence or absence of dendrites within the battery cell.

20. The system of claim 17, wherein the battery cell is a lithium ion battery cell.

\* \* \* \* \*